(12) United States Patent
Ota et al.

(10) Patent No.: US 6,411,636 B1
(45) Date of Patent: Jun. 25, 2002

(54) NITRIDE SEMICONDUCTOR LASER AND METHOD OF FABRICATING THE SAME

(75) Inventors: Hiroyuki Ota; Kiyofumi Chikuma, both of Tsurugashima (JP)

(73) Assignee: Pioneer Corporation, Tokyo (JP)

( * ) Notice: Subject to any disclaimer, the term of this patent is extended or adjusted under 35 U.S.C. 154(b) by 0 days.

(21) Appl. No.: 09/468,082

(22) Filed: Dec. 21, 1999

(30) Foreign Application Priority Data

Dec. 22, 1998 (JP) .......................................... 10-364161
Jun. 25, 1999 (JP) .......................................... 11-180344

(51) Int. Cl.$^7$ ................................................. H01S 5/00
(52) U.S. Cl. ...................................................... 372/43
(58) Field of Search .............................. 372/43–45, 99; 117/3, 952

(56) References Cited

U.S. PATENT DOCUMENTS 6,069,394 A * 5/2000 Hasimoto et al. ........... 257/466
6,113,685 A * 9/2000 Wang et al. ................... 117/3

OTHER PUBLICATIONS

Kelly et al., "Optical Process for Liftoff of Group III–Nitride Films", Physica Status Solidi A, vol. 159, No. 1, Jan. 1997, pp. R3–R4.*

* cited by examiner

Primary Examiner—Paul Ip
Assistant Examiner—James Menefee
(74) Attorney, Agent, or Firm—Sughrue Mion, PLLC

(57) ABSTRACT

A method for fabricating a nitride-semiconductor laser constituted by superimposing a plurality of crystal layers respectively made of a group III nitride semiconductor $(Al_xGa_{1-x})_{1-y}In_yN$ ($0 \leq x \leq 1$, $0 \leq y \leq 1$) on a cleavable or parting substrate in order comprises the crystal layer forming step of forming a plurality of crystal layers on a cleavable or parting substrate, the step of applying a light beam from the substrate side toward the interface between the substrate and the crystal layers and thereby forming the decomposed-matter area of the nitride semiconductor, and the step of cleaving or parting the substrate along a straight line intersecting with the decomposed-matter area and thereby forming a cleavage plane.

15 Claims, 7 Drawing Sheets

NITRIDE SEMICONDUCTOR LASER AND METHOD OF FABRICATING THE SAME

BACKGROUND OF THE INVENTION

1. Field of the Invention

The present invention relates to a group III nitride semiconductor device (hereafter also referred to as a device simply) and, particularly to a fabrication method of a semiconductor laser device using the same material system.

2. Description of the Related Art

A semiconductor laser device has a resonator consisting of a pair of flat parallel planes or reflectors between which a multilayer semiconductor laser structure is formed. To operate the laser device, a pair of the mirror facets defining an optical cavity is necessary. For example, in case of a GaAs semiconductor laser device, since an epitaxially grown GaAs crystal used for the device and a GaAs wafer for the substrate thereof have a cleavage nature, this nature is utilized for the fabrication of the device. The resonator is formed in such a manner that straight lines of grooves are carved to the GaAs wafer at a predetermined interval of cavity length and thus, the wafer is cleaved along the grooves into bars by application of stress. Therefore, the cleavage of wafer facilitates to form automatically flat mirror planes parallel to each other in a process for forming the laser structure.

Thus, in the fabrication of a semiconductor laser device of Fabry-Perot type using a conventional semiconductor crystal such as GaAs, the mirror facets of the device have been formed by using the same cleavage properties of GaAs crystal substrate and GaAs multilayers.

On the other hand, in the case of group III nitride semiconductor device, it is inevitable to perform the epitaxial-growth of nitride crystal film on a substrate made of sapphire or SiC, because a nitride bulk crystal to be used in practice has not been manufactured yet.

SiC is not frequently used as a substrate for the nitride device, because the SiC substrate is expensive and a nitride film deposited on the SiC substrate easily cracks due to the difference in the thermal expansion coefficient therebetween, thus sapphire is commonly used as a substrate. In the case of epitaxial growth of nitride on a sapphire substrate, a high quality single-crystal film is obtained on a C-face i.e., (0001) plane of sapphire, or an A-face, i.e., (11$\overline{2}$0) plane (hereafter referred to as (11-20) plane) of sapphire.

The mirror facets may be formed by an etching process such as reactive ion etching (RIE) instead of the method using the cleavage, because it is hard to crack the sapphire substrate in comparison with the GaAs substrate having been used so far for semiconductor laser devices.

Reactive ion etching is mainly used as a method for obtaining the mirror facets of the nitride semiconductor laser on the sapphire substrate at present.

However, the resultant device with the mirror facet formed by the reactive ion etching has a disadvantage that the far-field pattern of its emitted light exhibits multiple spots. This multiple-spot phenomenon of the laser device is caused by the fact that the sapphire substrate cannot be effectively etched even by dry etching such as the reactive ion etching.

Figure 1:
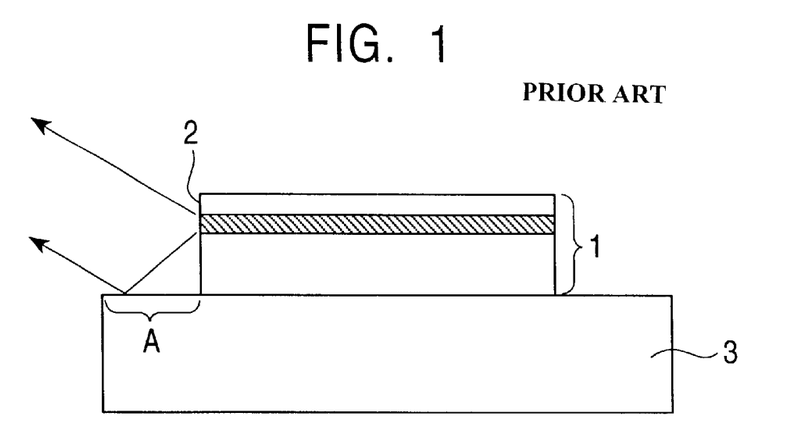
FIG. 1 is a schematic sectional view of a group III nitride-semiconductor laser device.

FIG. 1 shows a cross section of a laser device 1 fabricated on a sapphire substrate 3 with a mirror facet 2 formed by an etching process. A remaining portion of the sapphire substrate 3 without being etched as shown by (A) in FIG. 1 reflects a part of emitted light beam, an then the reflected light interferes with the main light beam, so that a far field changes to multiple spots. Since the alteration of the far-field pattern into multiple spots is fatal as a light source for reading an optical disk, making the device impractical.

A GaN laser have been initially fabricated by using an etched mirror obtained by the reactive ion etching. The mass-production-type GaN laser with the cleaved mirror is studied in view of the change of a far field pattern to multiple spots. It is a matter of course that a cleavage cannot be preferably formed on sapphire in mass production. Therefore, the following method have been used. First, after forming a GaN film with a thickness of approximately 2 $\mu$m on a sapphire substrate by metalorganic chemical vapor deposition (MOCVD), the substrate with the film is temporarily taken out of a reactor. A $SiO_2$ film is formed on the GaN film and stripe-like windows are opened on the film. After putting the film in the MOCVD system again, a GaN film is grown up to a thickness of approximately 10 $\mu$m to obtain a flat film. After that, the obtained wafer is subject to the hydride vapor phase epitaxial processes (HVPE) to form a GaN film on the wafer up to a thickness of approximately 200 $\mu$m. Next, the backside of the sapphire substrate of the obtained wafer is lapped to remove almost of the sapphire portion, and then the GaN substrate having a thickness of approximately 80 $\mu$m is obtained. The resultant substrate is set in the MOCVD system too perform epitaxial growth of a laster structure. Because the obtained wafer is very similar to a wafer of a conventional GaAs-based laser, it is possible to apply various treatments and thereafter cleaving the crystal substrate. In this way, a laser device is fabricated.

However, the conventional method as described above requires many steps, and is complicated. As a result, the method invites a very low yield of the group III nitride semiconductor devices. Such a method is not suitable for mass production.

OBJECT AND SUMMARY OF THE INVENTION

Therefore, an object of the present invention is to provide a group III nitride-semiconductor laser fabrication method from which high-quality mirror facets for a laser structure can be obtained with high reproducibility.

A nitride semiconductor laser device according to the present invention having successively grown crystal layers each made of a group III nitride semiconductor $(Al_xGa_{1-x})_{1-y}In_yN$ ($0 \leq x \leq 1$, $0 \leq y \leq 1$) comprises:

a cleavable or parting substrate;

a crystal layer made of the group III nitride semiconductor over the substrate;

a mirror facet for optical resonance consisting of a cleavage plane of the group III nitride semiconductor; and a decomposed-matter area of the nitride semiconductor interposed at an interface between the substrate and the crystal layer and disposed at an intersecting portion with the cleavage plane.

In an embodiment of the nitride semiconductor laser device according to the invention, the decomposed-matter area of the nitride semiconductor is formed by a light beam applied to the interface from the substrate side.

In another embodiment of the nitride semiconductor laser device according to the invention, the device further comprises a waveguide extending along a direction normal to the cleavage plane of the nitride semiconductor.

In a further embodiment of the nitride semiconductor laser device according to the invention, the waveguide has a ridge shape.

In a still further embodiment of the nitride semiconductor laser device according to the invention, the substrate is made of sapphire.

A fabrication method according to the present invention is a method for producing a nitride semiconductor laser device having crystal layers each made of a group III nitride semiconductor $(Al_xGa_{1-x})_{1-y}In_yN$ ($0 \leq x \leq 1$, $0 \leq y \leq 1$) and layered on a cleavable or parting substrate in order, the method comprising the steps of:

forming a plurality of crystal layers each made of a group III nitride semiconductor $(Al_xGa_{1-x})_{1-y}In_yN$ ($0 \leq x \leq 1$, $0 \leq y \leq 1$) on a cleavable or parting substrate;

applying a light beam from the substrate side toward the interface between the substrate and the crystal layer thereby forming the decomposed-matter area of a nitride semiconductor; and cleaving the substrate along a straight line intersecting the decomposed-matter area, thereby forming a cleavage plane of the crystal layer.

In an embodiment of the fabrication method according to the invention, the wavelength of the light beam is selected from wavelengths passing through the substrate and absorbed by the crystal layer in the vicinity of the interface.

In another embodiment of the fabrication method according to the invention, the method further comprises a step of forming a waveguide extending along a direction normal to the cleavage plane of the nitride semiconductor.

In a further embodiment of the fabrication method according to the invention, the crystal layers of the nitride semiconductor are formed by metal-organic chemical vapor deposition.

In a still further embodiment of the fabrication method according to the invention, the method further comprising a step of applying a light beam focused on an outer surface of the substrate to form a groove serving as a starting point of the aforementioned straight line in the step of forming the mirror facet for optical resonance.

According to the present invention, it is possible to obtain high-quality mirror facets with a high reproducibility by locally untying the crystal bond between the sapphire substrate and GaN crystal nearby the mirror facets of a laser device and thereby, cutting the GaN crystal nearby the laser facet cleave along its normal cleavage plane.

DETAILED DESCRIPTION OF THE PREFERRED EMBODIMENTS

Embodiments of group III nitride semiconductor laser devices according to the present invention are described below by referring to the accompanying drawings.

Although sapphire does not have a clear cleavage plane like a Si or GaAs wafer, a C-face sapphire easily crack along its (1$\bar{1}$00) plane (hereafter referred to as (1-100) plane), and also an A-face sapphire can be parted along its (1$\bar{1}$02) plane (hereafter referred to as (1-102) plane), so called R-plane, considerably close to the cleavage of ordinary crystal. The following methods are used to form the cavity mirrors of nitride semiconductor lasers on a sapphire substrate: First, a method of growing nitride semiconductor layers on a C-face sapphire substrate and then cracking along (1-100) plane of the sapphire substrate. Second, a method of growing nitride semiconductor layers on an A-face sapphire substrate and then cracking along (1-102) plane of the sapphire substrate.

As for the first method of mirror facet formation applied to the device grown on a C-face sapphire substrate, there are problems that a sapphire substrate cannot be cracked unless the substrate is made thin enough by lapping down the backside of the substrate or that it does not cleave with a high reproducibility. These problems are caused by the fact that (1-100) plane of sapphire is not a cleavage plane. Since sapphire is very hard crystal, it cannot be cracked along a marking line unless it is made thin enough, and it is necessary to reduce the thickness of a sapphire substrate down to approximately 100 $\mu$m in order to obtain a cleavage plane practical for a laser device. When lapping the backside of a wafer on which a device structure is already formed, the wafer is warped or distorted due to the difference between thermal expansion coefficients of sapphire and nitrides or due to the residual stress caused by lapping process. Thereby, when the back of a device wafer is lapped, the wafer is apt to fracture in the process. This is very disadvantageous for mass production.

Moreover, the crystallographic orientation of nitride grown on the C-face of sapphire tilts by an angle of 30° from the sapphire substrate orientation (the nitride is hereafter referred to as GaN because a typical binary compound is GaN). When parting the sapphire substrate on (1-100) plane thereof, GaN crystal on the sapphire substrate is to crack on (11-20) plane. The cleavage plane of GaN crystal is (1-100) plane. However, it is also possible to tentatively cleave the GaN crystal on (11-20) plane due to the GaN crystal's symmetry. When the crystal accurately cracks along (11-20) plane, a very preferable fracture plane can be obtained.

On the other hand, because (1-100) plane of sapphire is not a cleavage plane, it is possible to crack the sapphire even if a scribing line is drawn at a slightly deviated angle. Because GaN is cracked in a direction slightly deviated from (11-20) plane, the fracture facet consists of many (1-100) planes of GaN, each of which is the cleavage plane, forming a stepwise appearance. The stepwise facet causes degradation of the reflectivity of mirrors and perturbation of the wave front of emitted light. Thereby, the quality of a mirror facet for optical resonance of a laser device is deteriorated.

Whereas, the second method of mirror facet forming method applied to the device formed on the A-face sapphire substrate has a problem that the quality of the fracture plane of GaN is not sufficient.

Figure 2:
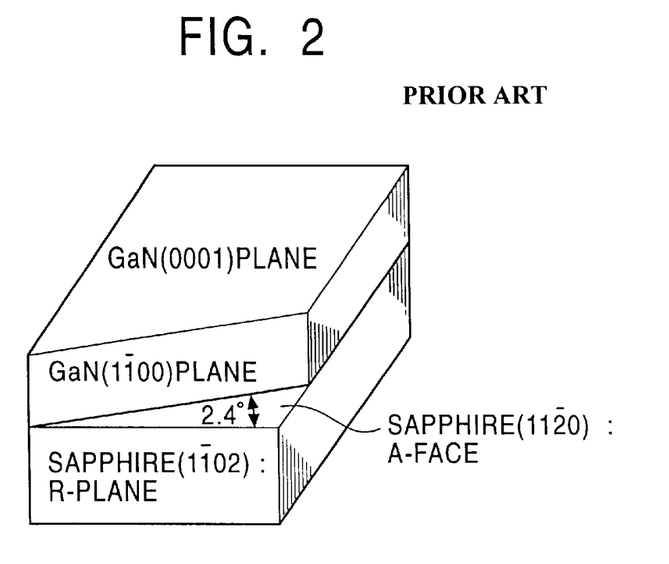
FIG. 2 is a schematic perspective view showing the lattice plane of a GaN crystal layer formed on a sapphire substrate.
Figure 3:
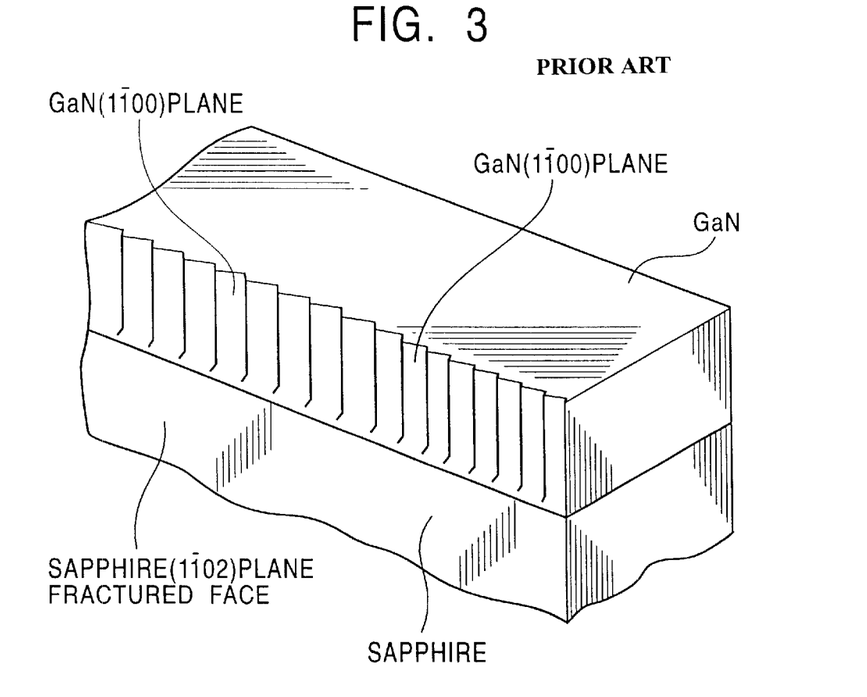
FIG. 3 is a schematic perspective view showing the fracture plane of a GaN crystal layer formed on a sapphire substrate.

Because the sapphire substrate can be easily cracked along its cleavage plane (1-102), so called R-plane, it is possible to cleave the sapphire having a thickness of 250 to 350 μm normally used as a substrate. However, (1-100) plane of GaN grown on the A-face of sapphire and the R-plane of the sapphire are deviated from each other by an angle of 2.4°. FIG. 2 depicts that situation. In FIG. 2, the angle 2.4° is exaggeratedly shown and the same is true for the subsequent drawings. Therefore, the striations shown in FIG. 3 appear on the fracture plane of GaN. This is because (1-100) plane of GaN appears in a stepwise manner similar to the case on a C-face sapphire. It seems that the crystal bond between a sapphire substrate and GaN crystal is stable. Sapphire is stably parted with the R-plane, the fracture plane of GaN shown in FIG. 3 is reproduciblly obtained. Therefore, in the case of the A-face sapphire substrate, the quality of fracture plane is not very good though it is reproducible.

In view of the experiment mentioned above, the present inventors have completed that present invention based on the result of studies of various method of producing a semiconductor laser device comprising group III nitride layers layered on the sapphire substrate to acquire a resonator of a high quality thereof. It should be noted that the embodiment described below simply illustrates the invention, and the invention is not limited thereto.

Figure 4:
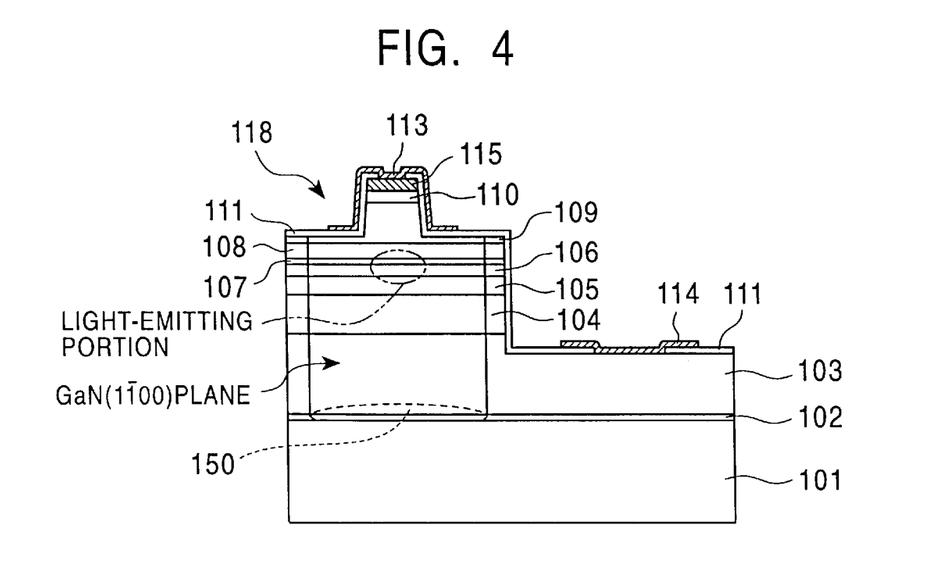
FIG. 4 is a schematic elevation view showing a GaN semiconductor laser device of an embodiment of the present invention, which is seen from the mirror facet for optical resonance.

FIG. 4 shows the group III nitride semiconductor laser of an embodiment. The semiconductor laser device is constituted of a GaN (or AlN) layer 102 formed at a low temperature, n-type GaN layer 103, n-type $Al_{0.1}Ga_{0.9}N$ layer 104, n-type GaN layer 105, active layer 106 mainly containing InGaN, p-type $Al_{0.2}Ga_{0.8}N$ layer 107, p-type GaN layer 108, p-type $Al_{0.1}Ga_{0.9}N$ layer 109, and p-type GaN layer 110 which are stacked on the single-crystal sapphire substrate 101 in order. An n-side electrode 114 and p-side electrodes 113 and 115 are connected to the n-type GaN layer 103 and p-type GaN layer 110. A ridge stripe portion 118 is formed on the p-type $Al_{0.1}Ga_{0.9}N$ layer 109. The device is covered with and protected by an insulating film 111 made of $SiO_2$ except electrodes.

The group III nitride semiconductor laser of the embodiment has a decomposed-matter area 150 of a nitride semiconductor disposed at the interface between the sapphire substrate 101 and its crystal layer 103 and having a cleavage plane for resonance i.e., (1-100) plane intersecting the superimposed crystal layers 102 to 110. The decomposed-matter area 150 of the nitride semiconductor is formed by a light beam applied to the interface from the substrate side. In the decomposed-matter area 150 of nitride semiconductor formed by laser-beam irradiation, the crystal bond between a sapphire substrate and GaN crystal is locally broken. Therefore, a layered portion of GaN nearby a reflector over the decomposed-matter area 150 ideally cracks along the crystallographic cleavage plane of GaN without influence of the fracture of sapphire substrate in the mirror facet forming step. The wavelength of applied laser beam is selected from wavelengths absorbed by a GaN crystal layer and passing through the sapphire substrate. Absorbed light in the GaN crystal layer near the interface is almost converted into heat where many crystal defects are present. The temperature of the laser-beam applied area of a crystal layer nearby the sapphire substrate rapidly rises and GaN is decomposed into gallium and nitrogen.

This semiconductor laser device emits light by recombining electrons with holes in the active layer 106. The n-type GaN layer 105 and p-type GaN layer 108 serve as guide layers. Light generated in the active layer 106 is guided in the guide layers 105 and 108. Electrons and holes are effectively confined in the active layer 106 by setting band gaps of the guide layers 105 and 108 to values larger than that of the active layer 106. The p-type $Al_{0.2}Ga_{0.8}N$ layer 107 serves as a barrier layer for further enhancing the confinement of carriers (particularly, electrons), the n-type $Al_{0.1}Ga_{0.9}N$ layer 104 and the p-type $Al_{0.1}Ga_{0.9}N$ layer 109 serve as cladding layers respectively each formed to have refractive indexes lower than those of the guide layers 105 and 108. The wave guidance in the film-thickness direction is performed due to the difference between refractive indexes of the cladding layer and the guide layer. The ridge stripe portion 118 is formed in order to produce a lateral-directional step in an effective refractive index by changing the thickness of the cladding layer 109, thereby confining generated light in the lateral direction.

The n-type GaN layer 103 is a ground layer formed as a current path because sapphire serving as a substrate does not have any electric conductivity at all. Moreover, the GaN (or AlN) layer 102 formed as a low temperature growth layer is a so-called buffer layer that is formed to give a smoothing film on the sapphire substrate that is a different material for GaN.

The device structure shown in FIG. 4 is fabricated in the following fabricating steps in which layered structure for a laser device is formed on an A-face sapphire substrate whose both sides are mirror-finished through the metal-organic chemical vapor deposition (MOCVD).

First, the sapphire substrate 101 is set into an MOCVD reactor and held for 10 minutes in a hydrogen-gas flow at a pressure of 300 Torr and a temperature of 1050° C. to thermally clean the surface of the sapphire substrate 101. Thereafter, the temperature of the sapphire substrate 101 is lowered to 600° C., and ammonia ($NH_3$) which is a nitrogen material and TMA (trimethyl aluminium) which is an Al material are introduced into the reactor to deposit a buffer layer 102 made of AlN up to a thickness of 20 nm.

Then, supply of TMA is stopped, the temperature of the sapphire substrate 101 on which the buffer layer 102 is formed is raised to 1050° C. again while flowing only $NH_3$, and trimethyl gallium is introduced to form the n-type GaN ground layer 103 on the buffer layer 102. In this case, Me—$SiH_3$ (methyl silane) is added into a growth atmosphere gas as the precursor of Si serving as an n-type impurity.

When the n-type GaN ground layer 103 is grown up to approximately 4 μm, TMA is introduced to form the n-type AlGaN cladding layer 104. When the n-type AlGaN cladding layer 104 is grown up to approximately 0.5 μm, supply of TMA is stopped to grow the n-type GaN guide layer 105 up to 0.1 μm. When growth of the n-type GaN guide layer 105 is completed, supply of TMG and Me—$SiH_3$ is stopped, and lowering of temperature is started to set the substrate temperature to 750° C. When the substrate temperature reaches at 750° C., carrier gas is changed from hydrogen to nitrogen. When the gas-flow state is stabilized, TMG, TMI, and Me—$SiH_3$ are introduced to grow the active layer 106. When the active layer is formed, supply of TMG, TMI, and Me—$SiH_3$ is stopped, and the carrier gas is changed from nitrogen to hydrogen. When the gas-flow state is stabilized, the substrate temperature is raised to 1050° C. again and TMG, TMA, and Et—$CP_2Mg$ (ethyl cyclopentadienyl magnesium) as the precursor of Mg serving as a p-type impurity are introduced to form the p-type AlGaN layer 107 on the active layer 106 up to 0.01 μm. Then, supply of TMA is stopped to grow the p-type GaN guide layer 108 up to 0.1 μm and TMA is introduced again to grow the p-type AlGaN cladding layer 109 up to 0.5 μm. Moreover, the p-type GaN contact layer 110 is grown on the layer 109 up to 0.1 μm. Thereafter, supply of TMG and Et-CP$_2$Mg is stopped and temperature lowering is started. When the substrate temperature reaches 400° C., supply of NH$_3$ is also stopped. When the substrate temperature reaches room temperature, the sapphire substrate 101 is taken out of the reactor.

The obtained wafer is set into a heat treatment furnace to apply heat treatment for the p-type conversion.

A nickel (Ni) layer 115 with a thickness of 200 nm is formed on the surface changed to p-type as a p-side electrode by using the vacuum evaporation.

For the obtained wafer, a terrace for the p-side electrode, a recess for the n-side electrode, a current path structure for the n-side electrode are formed and a ridge-structure is formed on the terrace for the p-side electrode and a refractive-index waveguide structure for current confinement.

Figure 5:
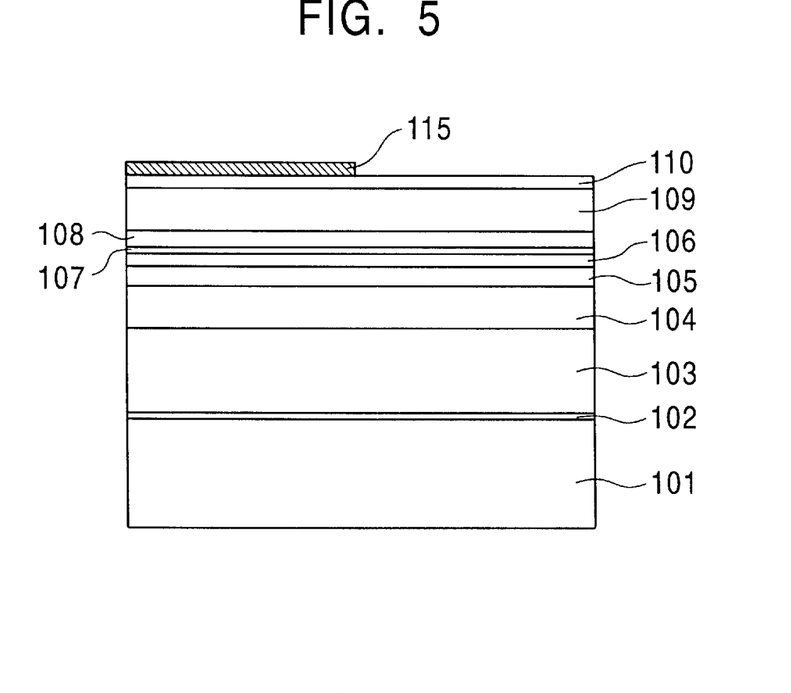
FIGS. 5 to 7 are schematic sectional views each showing a portion of a wafer of the semiconductor laser device at each fabricating step of an embodiment of the present invention.
Figure 6:
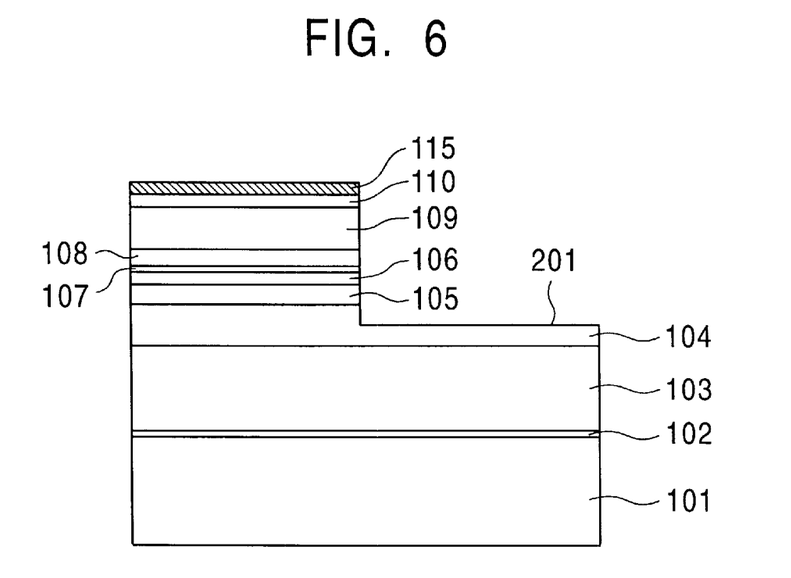

To form a current path for the n-side electrode, the Ni film is partly removed by wet etching, and the exposed area of the nitride semiconductor layer is partially etched by reactive ion etching (RIE) using Cl$_2$ (chlorine) gas by utilizing the remaining Ni film 115 as a mask as shown in FIG. 5. In this case, as shown in FIG. 6, etching is performed down to a depth where the n-type cladding layer 104 is slightly left to form a recessed portion 201.

Figure 7:
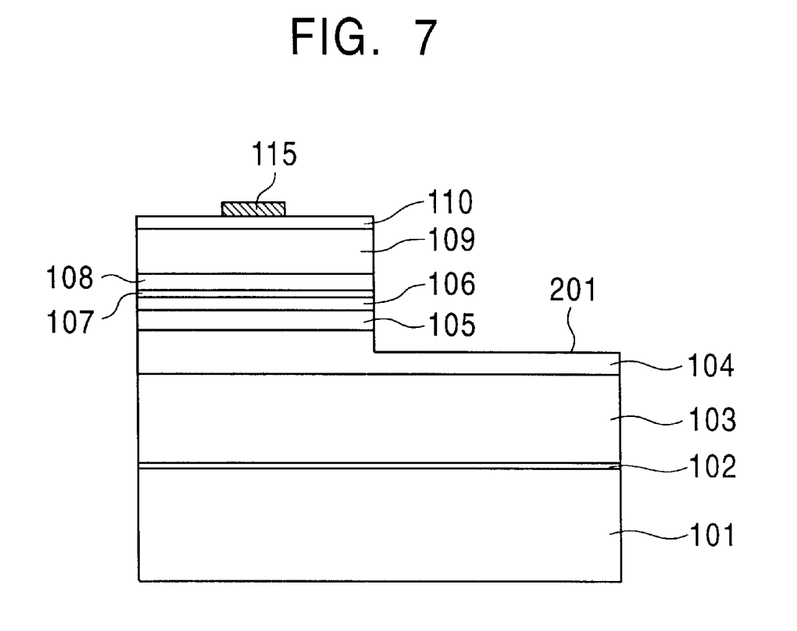

Then, as shown in FIG. 7, the Ni film is removed by wet etching while leaving a width of 5 μm to form the stripe 115 of the 5 μm-wide Ni film.

Figure 8:
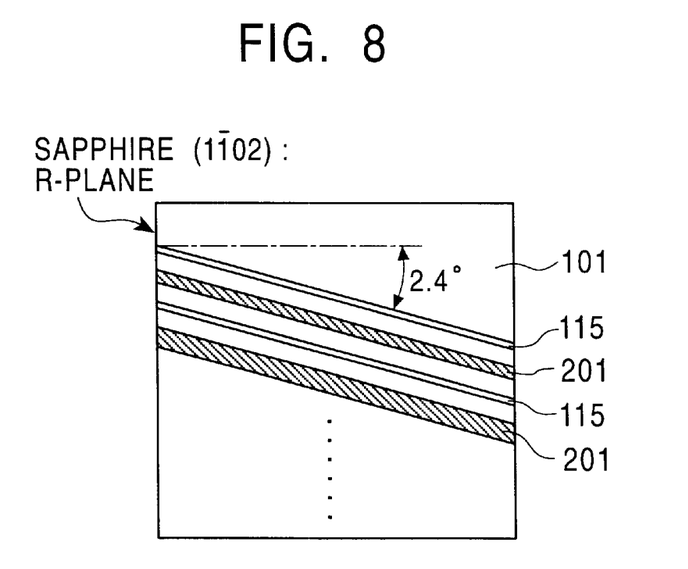
FIG. 8 is a schematic top view of a laser wafer in the semiconductor-laser fabricating step of another embodiment of the present invention.

In this case, as shown in FIG. 8, the longitudinal direction of the Ni stripe 115 is tilted up to an angle of 2.4° from the direction normal to the R-plane of sapphire. Also, the recessed portion 201 for forming an n-side electrode is formed with an angle of 2.4° in accordance with the tilt of the direction of the stripe 115. That is, a waveguide is formed to extend along the normal direction to the (1-100) plane which is the expected cleavage plane of nitride semiconductor.

Figure 9:
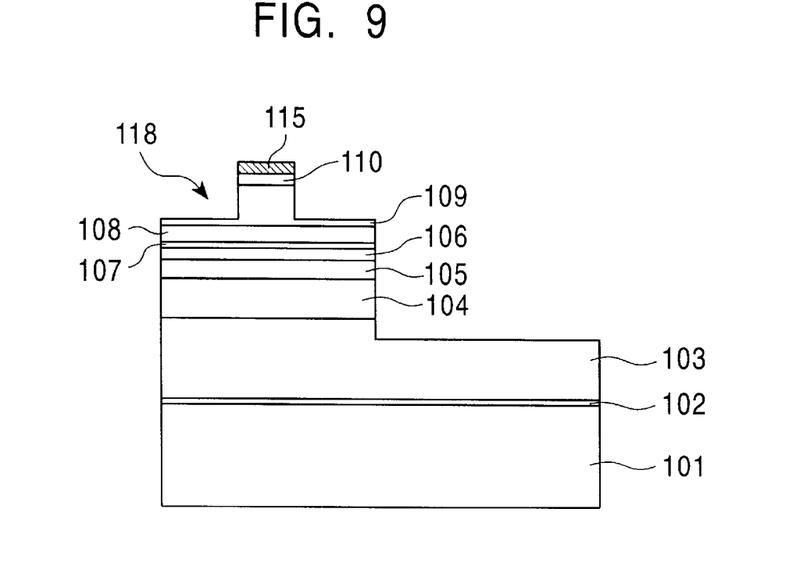
FIGS. 9 and 10 are schematic sectional views each showing a laser wafer in the semiconductor-laser fabricating step of an embodiment of the present invention.

Then, portions other than the portion immediately below the 5 μm-wide stripe portion, i.e., the contact layer 110 and p-type AlGaN cladding layer 9 are removed by reactive ion etching (RIE) using the Ni stripe 115 as a mask and leaving approximately 0.1 μm of the cladding layer 9 to form the narrow ridge structure 118 as shown in FIG. 9. In this case, the remaining n-type cladding layer 104 is simultaneously removed and the n-type GaN ground layer 103 is exposed.

An SiO$_2$ protective film is deposited on the wafer by sputtering. Thereafter, a 3 μm-wide window on the p-type ridge and a window portion for an n-type electrode are formed in the SiO$_2$ protective film by normal photolithography. Ti (titanium) is evaporated with a thickness of 50 nm and then, Al is evaporated with a thickness of 200 nm onto the portion where the n-type GaN layer 103 is exposed to form the n-side electrode 114. Then, 50 nm-thick Ni film is evaporated and Au is evaporated with a thickness of 200 nm onto the portion where a p-type GaN layer is exposed to form the p-side electrode 113. Thus, the individual device on the wafer has the structure shown in FIG. 10.

Figure 10:
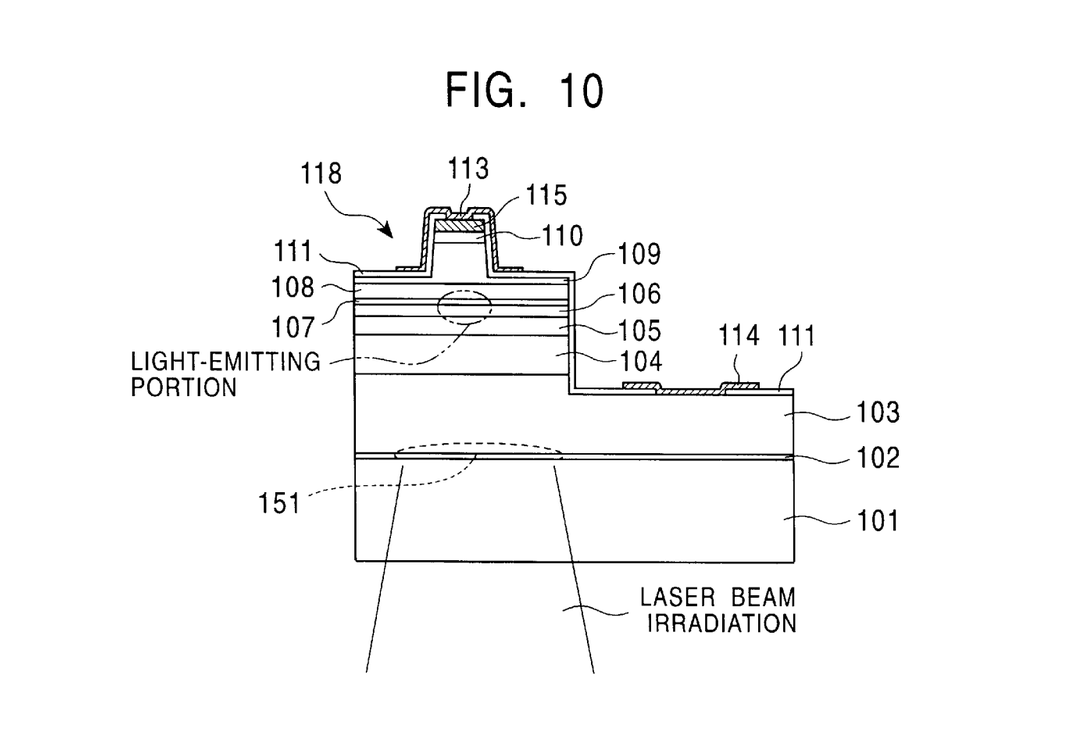
Figure 11:
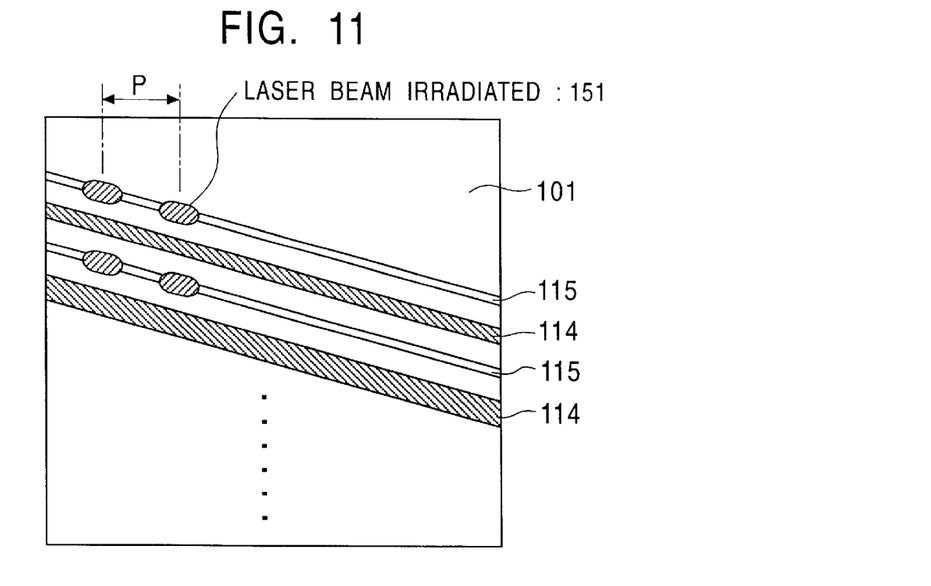
FIGS. 11 and 12 are schematic top views each showing a laser substrate in the semiconductor-laser fabricating step of another embodiment of the present invention.

After completing the device structure forming step, the step of forming the decomposed-matter area of the nitride semiconductor is executed. As shown in FIG. 10, a short-wavelength laser beam having wavelengths of 248 nm or 266 nm (e.g. KrF excimer laser, or a frequency quadrupled YAG laser) is irradiated from the back of the sapphire substrate 101 to decompose a sapphire-GaN interface. When a decomposed-matter area is formed, it is preferable to uniform the light intensity of the laser-beam applied to the interface by setting a homogenizer in the optical path of the laser beam to be emitted. Moreover, emitted light is focused onto the sapphire-GaN interface and irradiate the irradiation area 151 shown by slant lines in FIG. 11. The irradiation area 151 is repeatedly formed at a fabrication pitch such as the device length of a nitride semiconductor laser. It is preferable to set the energy density of irradiation light to hundreds mJ/cm$^2$ per pulse. If the energy density is much larger than hundreds mJ/cm$^2$, an device structure is broken. If the density is smaller than hundreds mJ/cm$^2$, the interface is not completely decomposed and thereby, sufficient effect cannot be obtained. Thus, the decomposed-matter area 150 of the nitride semiconductor is formed by the above-mentioned laser-beam irradiation.

Figure 12:
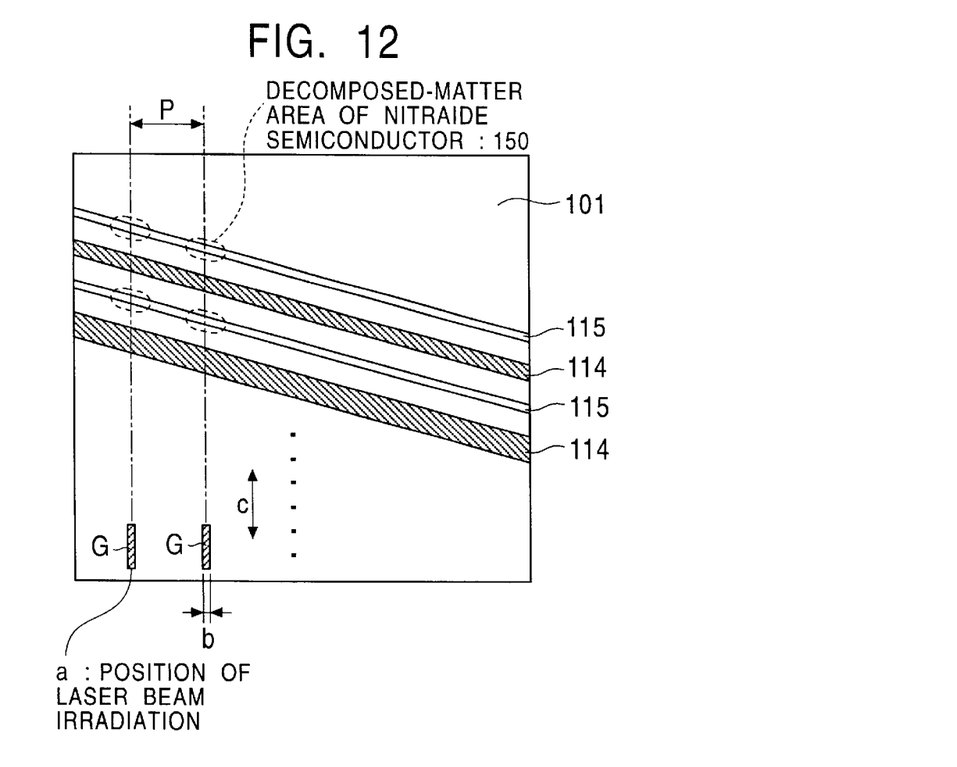

After the decomposed-matter forming step, the scribing step is executed. The laser-beam applying position is moved to a position nearby the periphery of the wafer shown by "a" in FIG. 12 to adjust the focal position of the irradiation light from the sapphire-GaN interface to the surface of sapphire substrate 101. In this case, the width of the laser-beam applying area shown by "b" in FIG. 12 is set to several microns. Moreover, the energy density of the irradiation laser beam is set to a value larger by 20 times or more than the energy density for the decomposition of the sapphire-GaN interface. By performing laser-beam irradiation in accordance with the setting, it is possible to evaporate the sapphire in a narrow irradiation area by heat because sapphire slightly absorb the wavelength and to form a fine groove G on the surface of the sapphire substrate 101. The laser beam (or a substrate support stand) is moved in the direction shown by "c" in FIG. 12 to form the groove G at a predetermined depth and length. The marking operation by the laser (so-called scribing) is repeatedly performed in accordance with the pitch of the device length of the nitride semiconductor laser.

Thereafter, the sapphire substrate is cleaved in the direction shown by the alternate long and short dash line in FIG. 12 by using the groove G as a starting point. As a result, laser bars are obtained each having comparatively large cleavage planes for cavity mirror at the end of the crystal layers.

In the case of the present invention, groove formation by laser-beam irradiation is performed only at the margin of the laser wafer. Therefore, it is preferable to reduce the thickness of a substrate down to approximately 100 μm in order to improve the quality of cleavage.

Moreover, it is preferable that a decomposition area by irradiation be as small as possible, because the present invention decomposes the interface between sapphire and GaN by heat. This implies that a high accuracy is required for a scribing position for cleavage. In general, when scribing is performed with a conventional diamond point, positional alignment is separately performed for the laser-beam irradiation in the decomposed-matter forming step and the following scribing step. Therefore, a high-accuracy and complex alignment is necessary between the both steps. The scribing method of the present invention does not require any realignment of a wafer because irradiation and scribing are performed by the same apparatus.

Furthermore, when a high-hardness material such as sapphire is scribed by an ordinary scribing apparatus using a diamond point, the point is seriously abraded. However, the present invention has advantage in that the groove bottom having a micron-order curvature governs cleavability. Moreover, the stability of the groove bottom can be easily maintained.

A dielectric multilayer reflection coating is formed on the fracture plane (cleavage plane) of a fabricated laser bar by a sputtering system. By further separating the laser bar into discrete chips by means of secondary cleavage, the device shown in FIG. 4 is obtained. Hereafter, similarly to the case of a conventional laser device, the device is die-bonded to a sub-mount, set to a stem, and wire-bonded and moreover, through subsequent steps, and finally a laser device is completed.

As described above, when forming a laser structure on the A-face of a sapphire substrate and parting sapphire on its R-plane without irradiating a laser beam, fine striations shown in FIG. 3 are formed on the surface of GaN. This is because the wafer cracks along the R-plane of the sapphire since a major part of the wafer is made of sapphire. As described above, the R-plane of sapphire tilts by an angle of 2.4° from (1-100) plane of GaN and even after a crack reaches the sapphire-GaN interface, the crack propagates along the R-plane of ground sapphire up to a certain extent. However, because GaN tends to crack on its crystallographic cleavage plane (1-100), a plurality of (1-100) planes form in a stepwise fracture manner.

In the case of the present invention, the step of performing irradiation by a short-wave high-output laser is added. While sapphire serving as a substrate is almost transparent at 248 nm which is the wavelength of a laser beam used for the irradiation, GaN absorbs the irradiation beam with a small penetration depth because it has a absorption edge of 365 nm. Moreover, because of a large lattice mismatch (15%) present between sapphire substrate and GaN, extremely dense defects are present in the GaN nearby the interface and thereby, absorbed light is almost converted to heat. The temperature of an area of GaN nearby the sapphire substrate suddenly rises and thus, GaN is decomposed into gallium and nitrogen. Therefore, as for this area, direct bond between sapphire crystal and GaN are disconnected.

Described below in detail in the case in which a sapphire substrate is cleaved along the R-plane according to the invention.

Figure 13:
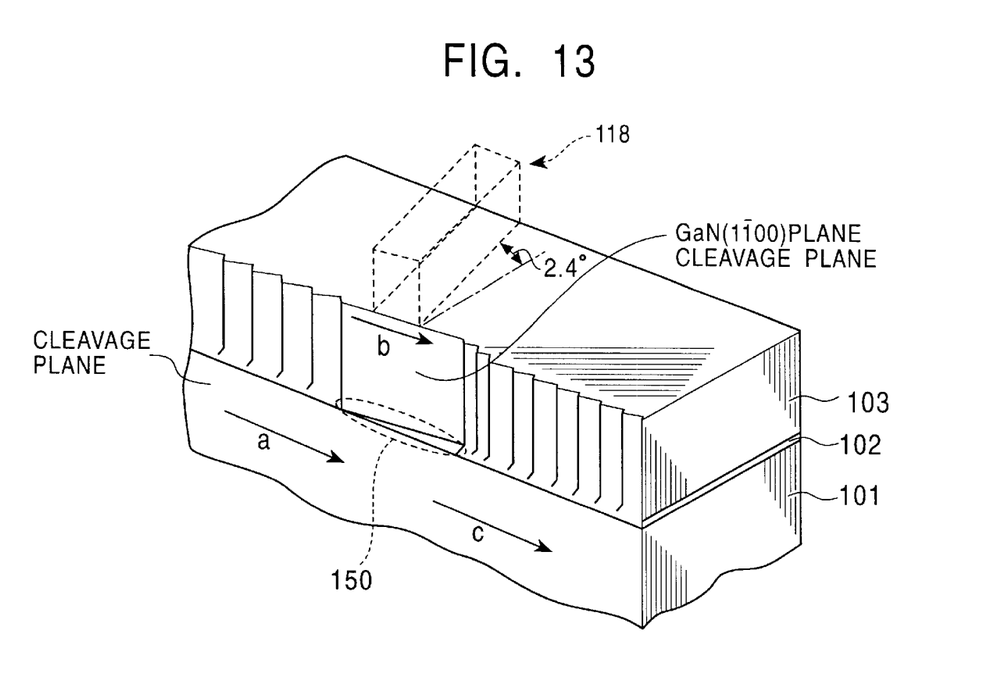
FIG. 13 a schematic perspective view showing the fracture plane of a GaN crystal layer formed on an A-face sapphire substrate.

As shown in FIG. 13, when a crack propagating along the R-plane reaches the decomposed-matter area 150 formed by laser-beam irradiation (arrow "a"), GaN can crack along (1-100) plane which is the natural cleavage plane of GaN because ground sapphire and GaN are not directly bonded within the area 150. Therefore, the portion of the crack within the GaN layer propagates along (1-100) plane of GaN (arrow "b"). Moreover, the portion of the crack in the sapphire substrate directly propagates along the R-plane (arrow "c"). When the crack reaches the boundary of the decomposed-matter area 150, GaN starts to fracture in a stepwise manner again because GaN is tightly integrated with sapphire thereafter. Thus, the partable plane of sapphire and the cleavage plane of GaN branch off from each other. By setting the length of the branched portion of cleavage plane, that is, the laser-irradiation length to a value equal to or larger than a ridge stripe width, a very smooth mirror facet is obtained.

As described above, the R-plane of a sapphire substrate tilts from an end face of the laser device by an angle of 2.4°. However, no problem occurs because both the ridges and electrodes are formed with an angle of 2.4° and a waveguide is vertical to (1-100) plane which is the cleavage plane of GaN.

In the case of the aforementioned embodiment, the device is formed on an A-face sapphire substrate. It is possible to form a device with a ridge-type laser structure on a C-face sapphire substrate, as is described in the second embodiment.

Figure 14:
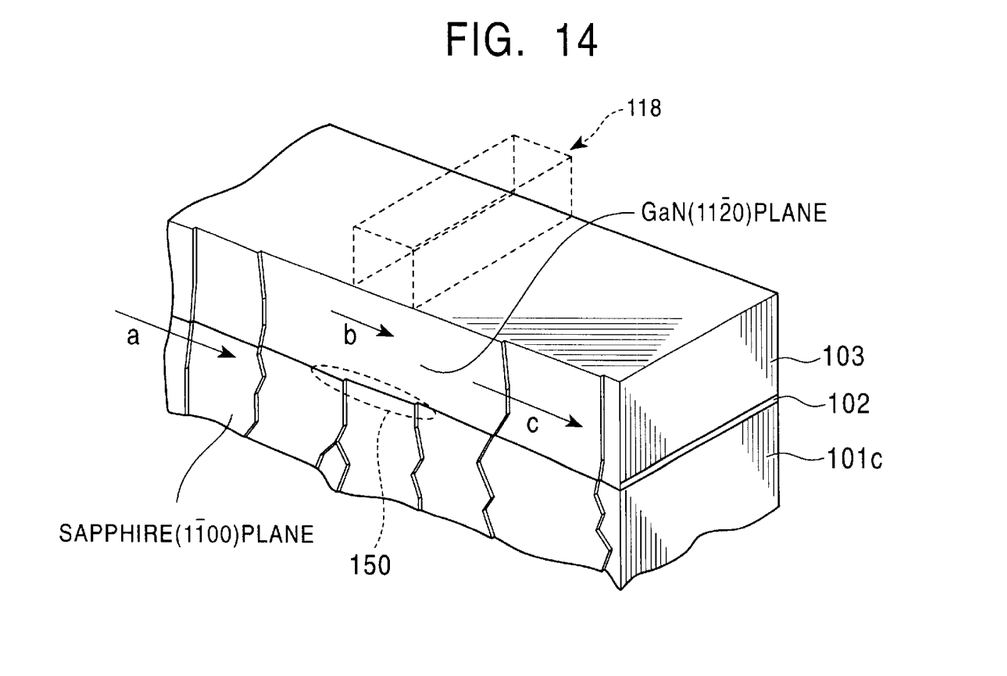
FIG. 14 is a schematic perspective view showing the fracture plane of a GaN crystal layer formed on a C-face sapphire substrate.

FIG. 14 shows a perspective view of the vicinity of the fracture plane of a laser device using C-face substrate 101c fabricated in the same steps as those of the first embodiment. When cracking the sapphire substrate 101c on (1-100) plane, GaN on the substrate 101c is cracked on (11-20) plane that is not the natural cleavage plane (1-100). However, because of symmetry of GaN crystal, when a crack accurately advances in the direction along (11-20) plane, a very preferable fracture plane is obtained. However, unless a scribing line strictly extends along (1-100) plane, the fracture plane of sapphire becomes stepwise and the fracture plane of GaN on the sapphire also becomes stepwise.

As shown in FIG. 14, when a crack propagating almost along (1-100) plane reaches the decomposed-matter area of a nitride semiconductor (arrow "a"), GaN can crack along its (11-20) plane because ground sapphire and GaN are not directly bonded each other within the area 150 and the portion of the crack propagates along (11-20) plane of GaN (arrow "b"). Moreover, after passing through the decomposed-matter area 150, the GaN fracture plane becomes stepwise because GaN is bonded to sapphire (arrow "c"). Thus, because the decomposed-matter area 150 is formed by setting a laser-beam irradiation length to a value equal to or greater than a ridge stripe width, a very smooth facet plane is formed at the end of a laser structure.

According to the present invention, an atomically flat plane is obtained because a reflector plane, which is one of the most important portions of a laser device, is constituted of the crystallographic cleavage plane of a nitride semiconductor itself.

Moreover, because it is possible to crack a sapphire substrate without greatly reducing its thickness, a trouble such as wafer fracture during the lapping process does not occur. Furthermore, because the thickness of the device is kept large, the device can be handled with relative ease, and superior for mass production.

What is claimed is:

1. A nitride semiconductor laser device having crystal layers layered each made of a group III nitride semiconductor $(Al_xGa_{1-x})_{1-y}In_yN$ ($0 \leq x \leq 1$, $0 \leq y \leq 1$) comprising:
    a cleavable or parting substrate;
    a crystal layer made of the group III nitride semiconductor over the substrate;
    a decomposed-matter area of the nitride semiconductor interposed at an interface between the substrate and the crystal layer;
    a mirror facet for optical resonance consisting of a cleavage plane of the group III nitride semiconductor derived from and restricted by said decomposed-matter area and appearing over the decomposed-matter area; and
    a non-decomposed area of the nitride semiconductor surrounding said decomposed-matter area in said interface and having a larger area than said decomposed-matter area to directly bond the substrate and the crystal layer.

2. A nitride semiconductor laser device according to claim 1, wherein the decomposed-matter area of the nitride semiconductor is formed by a light beam applied to the interface from the substrate side.

3. A nitride semiconductor laser device according to claim 1 further comprising a waveguide extending along a direction normal to the cleavage plane of the nitride semiconductor.

4. A nitride semiconductor laser device according to claim 3, wherein the waveguide has a ridge shape.

5. A nitride semiconductor laser device according to claim 1, wherein the substrate is made of sapphire.

6. A semiconductor laser device, comprising:

a substrate;

a crystal layer disposed over the substrate, wherein the crystal layer comprises a group III nitride semiconductor;

a decomposed-matter area located at an interface between the substrate and the crystal layer;

a mirror facet for optical resonance disposed over the decomposed-matter area, wherein the mirror facet contains a cleavage plane having a size corresponding to a size the decomposed-matter area; and a non-decomposed area that surrounds the decomposed-matter area at the interface and that has an area than is larger than an area of the decomposed-matter area.

7. The device as claimed in claim 6, wherein a cross-sectional lateral dimension of said cleavage plane is defined by a cross-sectional lateral dimension of said decomposed matter area.

8. The device as claimed in claim 6, wherein said non-decomposed area directly bonds the substrate and the crystal layer.

9. The device as claimed in claim 6, wherein the mirror facet comprises the group III nitride semiconductor.

10. The device as claimed in claim 6, wherein the group III nitride semiconductor comprises an $(Al_xGa_{1-x})_{1-y}In_yN$ ($0 \leq x \leq 1$, $0 \leq y \leq 1$) semiconductor.

11. The device as claimed in claim 9, wherein the group III nitride semiconductor comprises an $(Al_xGa_{1-x})_{1-y}In_yN$ ($0 \leq x \leq 1$, $0 \leq y \leq 1$) semiconductor.

12. The device as claimed in claim 6, wherein the decomposed-matter area is formed by a light beam applied to the interface from a side of the substrate.

13. The device as claimed in claim 6, further comprising a waveguide extending along a direction normal to the cleavage plane.

14. The device as claimed in claim 12, wherein the waveguide has a ridge shape.

15. The device as claimed in claim 6, wherein the substrate comprises sapphire.

* * * * *